United States Patent
Jin et al.

(10) Patent No.: US 10,276,823 B2
(45) Date of Patent: Apr. 30, 2019

(54) DISPLAY PANEL AND DISPLAY APPARATUS

(71) Applicants: Shanghai Tianma AM-OLED Co., Ltd., Shanghai (CN); Tianma Micro-Electronics Co., Ltd., Shenzhen (CN)

(72) Inventors: Jian Jin, Shanghai (CN); Congyi Su, Shanghai (CN)

(73) Assignees: Shanghai Tianma AM-OLED Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 104 days.

(21) Appl. No.: 15/588,937

(22) Filed: May 8, 2017

(65) Prior Publication Data
US 2017/0244061 A1 Aug. 24, 2017

(30) Foreign Application Priority Data

Dec. 28, 2016 (CN) .......................... 2016 1 1236764

(51) Int. Cl.
*G09G 3/30* (2006.01)
*H01L 51/52* (2006.01)
*H01L 27/32* (2006.01)
*G09F 9/30* (2006.01)
*G06F 3/0488* (2013.01)

(52) U.S. Cl.
CPC ........ *H01L 51/5237* (2013.01); *G06F 3/0488* (2013.01); *G09F 9/30* (2013.01); *H01L 27/3225* (2013.01); *H01L 27/3246* (2013.01); *H01L 27/3258* (2013.01); *H01L 51/5256* (2013.01); *H01L 51/5293* (2013.01); *H01L 2251/53* (2013.01)

(58) Field of Classification Search
CPC ............ H01L 51/5237; H01L 51/5256; H01L 51/5293; H01L 27/3225; G09G 3/3258; G09G 3/3275; G09G 3/3266; G09G 2310/08
USPC .......................................... 345/76, 204, 690
See application file for complete search history.

(56) References Cited

U.S. PATENT DOCUMENTS

2014/0131683 A1* 5/2014 Kim .................... H01L 51/5253
257/40
2017/0053973 A1* 2/2017 Park .................... H01L 51/5246

FOREIGN PATENT DOCUMENTS

| CN | 103811530 A | 5/2014 |
|---|---|---|
| CN | 104103665 A | 10/2014 |
| CN | 105280677 A | 1/2016 |
| CN | 106158881 A | 11/2016 |

* cited by examiner

*Primary Examiner* — Jennifer T Nguyen
(74) *Attorney, Agent, or Firm* — Anova Law Group, PLLC (57) ABSTRACT

A display panel and a display apparatus are provided. The display panel comprises a substrate including a display region and a non-display region; a display element disposed in the display region of the substrate; and at least one bank disposed in the non-display region of the substrate and surrounding the display region. The at least one bank comprises at least one inorganic layer and at least one metal layer, and the at least one inorganic layer encapsulates the at least one metal layer.

20 Claims, 4 Drawing Sheets

DISPLAY PANEL AND DISPLAY APPARATUS

CROSS-REFERENCES TO RELATED APPLICATIONS

This application claims the priority of Chinese Patent Application No. CN201611236764.6, filed on Dec. 28, 2016, the entire contents of which are incorporated herein by reference.

FIELD OF THE DISCLOSURE

The present disclosure generally relates to the display technology and, more particularly, relates to a display panel and a display apparatus thereof.

BACKGROUND

Organic light-emitting diode (OLED), also known as organic electroluminescent device, refers to a device in which the luminous material is driven by the electric field, and the carriers are injected and recombined in the luminous material to emit light. OLED display panels perform better than thin-film-transistor liquid crystal displays (TFT-LCDs) in terms of image quality, power consumption, and cost. However, the life time of the OLED is often easily degraded by the ambient moisture and oxygen. Thus, OLED display panels highly desire a good encapsulation to isolate the ambient moisture and oxygen.

Thin film encapsulation (TFE) layer used for isolating the ambient moisture and oxygen often has a multi-film stacked configuration which includes two or more thin film layers. The thin films may be divided into inorganic thin film layers and organic thin film layers according to the function. The main function of the inorganic thin film layer is to block the moisture and oxygen in the surrounding environment, while the main function of the organic thin film layer is to provide a flat film deposition condition for the subsequent formation of the inorganic thin film layer, relieve the stress, and cover the surface steps and impurities to provide an excellent particle encapsulation. However, the organic thin film layer may have poor moisture and oxygen barrier properties.

In the fabrication of organic electroluminescent devices, to define the boundaries of the organic thin film layer in the thin film encapsulation layer, a non-display region of the organic electroluminescent device is often provided with a bank for blocking the organic thin film layer in the film encapsulation layer. The inorganic thin film layer of the thin film encapsulation layer covers the bank of the non-display region, thereby isolating the ambient moisture and oxygen.

However, the bank is often made of stacked multi-layer organic thin films without the moisture and oxygen barrier properties. When there is a defect in the inorganic thin film layer of the thin film encapsulation layer covering the bank, the ambient moisture and oxygen may quickly penetrate the bank into the display region of the organic electroluminescent device, and corrode the organic electroluminescent device. Thus, the display performance of the organic electroluminescent device may be significantly degraded.

The disclosed display panel, and display apparatus are directed to solve one or more problems set forth above and other problems.

BRIEF SUMMARY OF THE DISCLOSURE

One aspect of the present disclosure provides a display panel. The display panel comprises a substrate including a display region and a non-display region; a display element disposed in the display region of the substrate; and at least one bank disposed in the non-display region of the substrate and surrounding the display region. The at least one bank comprises at least one inorganic layer and at least one metal layer, and the at least one inorganic layer encapsulates the at least one metal layer.

Another aspect of the present disclosure provides a display apparatus comprising a display panel. The display panel comprises a substrate including a display region and a non-display region; a display element disposed in the display region of the substrate; and at least one bank disposed in the non-display region of the substrate and surrounding the display region. The at least one bank comprises at least one inorganic layer and at least one metal layer, and the at least one inorganic layer encapsulates the at least one metal layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

The present disclosure provides an improved display panel and a display apparatus thereof, which are directed to solve the problem that the ambient moisture and oxygen penetrate the bank into the display region to corrode the organic electroluminescent device, when there is a defect in the inorganic thin film layer covering the bank. Thus, the ambient moisture and oxygen may be effectively prevented from penetrating the bank, and the display region may be prevented from being corroded by the ambient moisture and oxygen.

The present disclosure provides a display panel. The display panel may comprise substrate including a display region and a non-display region, a display element disposed in the display region of the substrate, and at least one bank disposed in the non-display region of the substrate and surrounding the display region. The at least one bank may comprise at least one inorganic layer and at least one metal layer, and the least one inorganic layer may encapsulate the least one metal layer.

The display element may include a plurality of light-emitting elements. The light-emitting elements may be any appropriate light-emitting elements, such as organic and inorganic light-emitting elements. In one embodiment, the light-emitting elements of the display panel may be formed by vapor deposition. The light-emitting elements may have a multilayer structure. In addition to a light-emitting layer, the light-emitting element may also include an electron-transporting layer and a hole-transporting layer for balancing electrons and holes, and an electron injecting layer and a hole injecting layer for enhancing the electrons and holes injection. The light-emitting element may also include other appropriate layers.

The light-emitting element in the display panel is sensitive to external environmental factors, such as moisture and oxygen. When the light-emitting element in the display panel is exposed to moisture or oxygen, the performance of the display panel may be significantly degraded or destroyed. To improve the lifetime and stability of the display panel, an encapsulation layer is often disposed on the light-emitting element to realize an encapsulation. The encapsulation layer may have a single layer or a multilayer structure, and the encapsulation layer may be formed by organic film layers or inorganic film layers, or organic film layers and inorganic film layers stacked together.

Generally, the organic thin film layer in the encapsulation layer does not block the ambient moisture and oxygen, while the inorganic thin film layer in the encapsulation layer mainly prevents the ambient moisture and oxygen from penetrating the display region of the display panel. Thus, when there is a defect in the inorganic thin film layer of the encapsulation layer, the ambient moisture and oxygen may permeate the display region of the display panel through the defect in the inorganic thin film layer of the encapsulation layer, damaging the light-emitting element in the display region.

In the disclosed embodiments, at least one bank may be disposed in the non-display region of the substrate and surrounding the display region. The bank may comprise at least one inorganic layer and at least one metal layer, and the inorganic layer may encapsulate the metal layer. When there is a defect in the inorganic thin film layer of the thin film encapsulation layer covering the bank, the inorganic layer in the bank and encapsulating the metal layer may effectively block the ambient moisture and oxygen, which enter through the defects in the inorganic layer of the thin film encapsulation layer.

Meanwhile, when the metal layer is in contact with the moisture in the ambient environment, a dense oxide film may be formed, which may further prevent the lateral erosion in the display region of the display panel caused by the ambient moisture and oxygen entering through the defects in the inorganic layer of the thin film encapsulation layer. Thus, the capability of the display panel to block ambient moisture and oxygen may be enhanced, and the life time of the organic electroluminescent device may be improved, accordingly.

Figure 1:
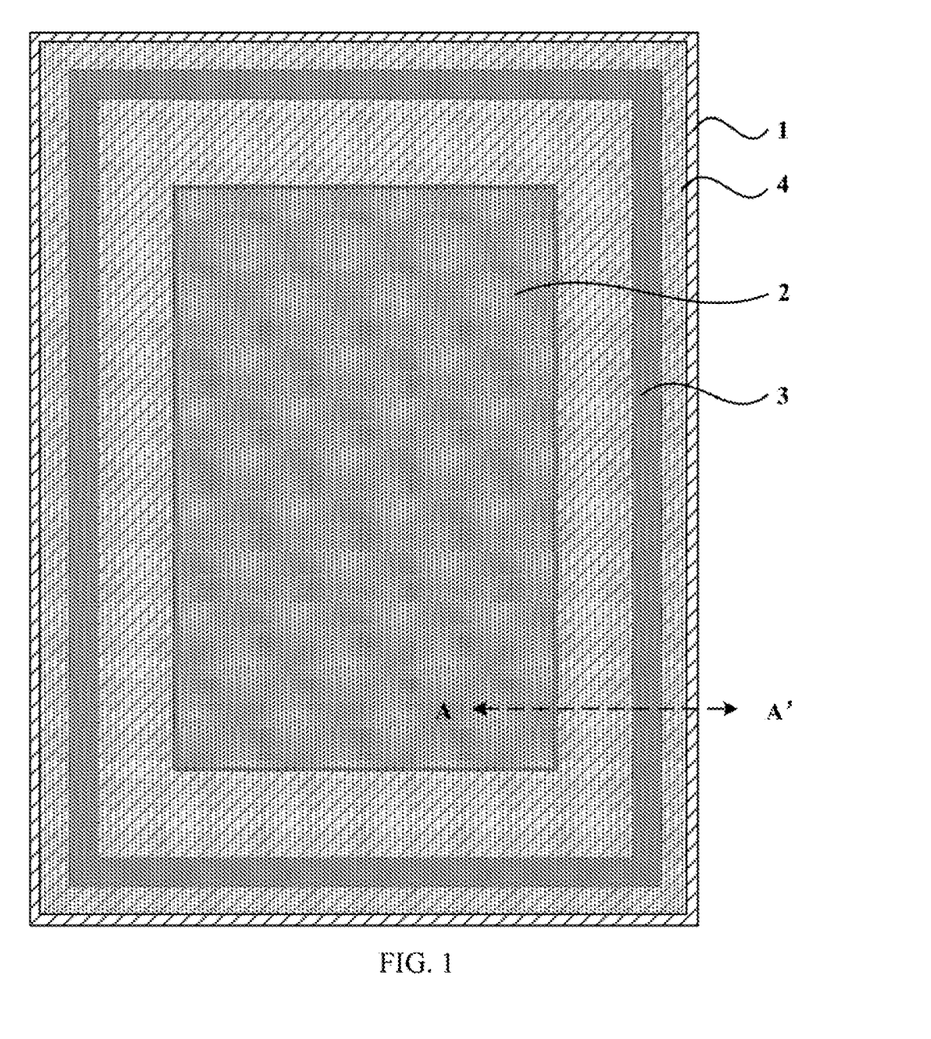
FIG. 1 illustrates a top view of an exemplary display panel consistent with the disclosed embodiments.
Figure 2:
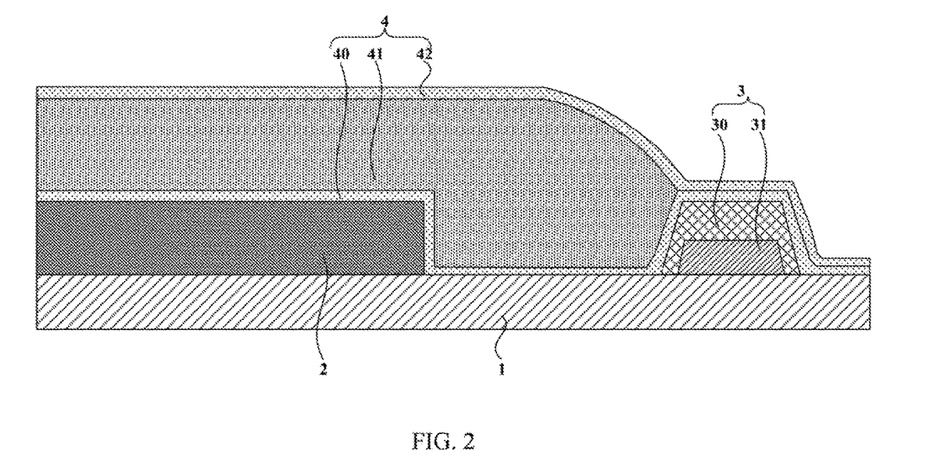
FIG. 2 illustrates an AA' sectional view of an exemplary display panel in FIG. 1 consistent with the disclosed embodiments.

FIG. 1 illustrates a top view of an exemplary display panel consistent with the disclosed embodiments. FIG. 2 illustrates a AA' sectional view of an exemplary display panel in FIG. 1 consistent with the disclosed embodiments.

As shown in FIG. 1 and FIG. 2, the display panel may comprise a substrate 1, a display element 2, and at least one bank 3. The substrate 1 may comprise a display region and a non-display region, the display element 2 may be disposed in the display region of the substrate 1, and the bank 3 may be disposed in the non-display region of the substrate 1 and surrounding the display region of the substrate 1. The bank 3 may comprise at least one inorganic layer 30 and at least one metal layer 31, and the inorganic layer 30 may encapsulate the metal layer 31.

In one embodiment, as shown in FIG. 2, the bank 3 may comprise an inorganic layer 30 and a metal layer 31, and the inorganic layer 30 may encapsulate the metal layer 31. In another embodiment, the bank 3 may comprise more than one inorganic layer 30 and more than one metal layer 31, and the inorganic layer 30 may encapsulate the metal layer 31. In another embodiment, two or more banks may be disposed in the non-display region of the substrate 1 and surrounding the display region of the substrate 1 to block ambient moisture and oxygen.

In certain embodiments, the display panel may also include a thin film encapsulation layer 4, which may cover the display element 2. The film encapsulation layer 4 may comprise at least one inorganic layer. For example, the film encapsulation layer 4 may comprise a plurality of inorganic layers, or a plurality of organic layers, or a plurality of organic layers and inorganic layers stacked together.

In one embodiment, as shown in FIG. 2, the thin film encapsulation layer 4 may comprise an inorganic layer 40, an inorganic layer 42, and an organic layer 41. The organic layer 41 may be disposed between the inorganic layer 40 and the inorganic layer 42. Both the inorganic layer 40 and the inorganic layer 42 may encapsulate the bank 3. The bank 3 has a first surface facing the substrate 1 and an opposing surface. The inorganic layer 40 and the inorganic layer 42 may be disposed on the opposing surface of the bank 3.

The configuration of the film encapsulation layer 4 in FIG. 2 is for illustrative purposes and is not intended to limit the scope of the present disclosure. In practical applications, the numbers and the arrangement of the organic layers and inorganic layers in the film encapsulation layer may be determined according to the production demand of actual products. The thin film encapsulation layer 4 may be able to effectively prevent the ambient moisture and oxygen from entering the display region, thereby reducing the damages caused by the ambient moisture and oxygen to the light-emitting element of the display panel.

Thus, due to the thin film encapsulation layer 4, when the display panel stays in an environment of moisture or oxygen, the light-emitting element of the display panel may be effectively isolated from the ambient moisture and oxygen and, accordingly, the performance of the display panel may not be degraded. Thus, the life time and stability of the display panel may be improved.

Before forming the thin film encapsulation layer, the display element 2 may be first formed on the display region of the substrate 1, and the bank 3 may be formed in the non-display region of the substrate 1. The display element 2 has a first surface facing the substrate 1 and an opposing surface. The bank 3 has a second side adjacent to the display element 2 and an opposing side. The inorganic layer 40, the organic layer 41, and the inorganic layer 42 of the thin film encapsulation layer 4 may be sequentially deposited on the substrate, e.g., on the opposing surface of the display element 2. Thus, in the display region, the formed thin film encapsulation layer 4 may cover the display element 2.

However, the bank 3 may block the organic layer 41 in the thin film encapsulation layer 4. That is, when the organic layer 41 in the film encapsulation layer 4 is deposited on the substrate 1, the bank 3 may prevent the organic layer 41 in the film encapsulation layer 4 from diffusing toward the opposing side of the bank 3, i.e., the side far away from the display element 2. Thus, at least one inorganic layer in the film encapsulation layer 4 may cover the bank 3.

The thickness of the bank 3, the thickness of the inorganic layer 30 in the bank, and the thickness of the metal layer 31 in the bank may be determined according to various application scenarios. In one embodiment, the thickness h of the bank 3 may be configured to be approximately 200 nm≤h≤4000 nm, and the thickness h1 of the inorganic layer 30 in the bank may be configured to be approximately 100 nm≤h1≤1000 nm, and the thickness h2 of the metal layer 31 in the bank may be configured to be approximately 100 nm≤h2≤500 nm.

The bank 3 may be disposed in the non-display region of the substrate 1 and surrounding the display region of the substrate 1, and the inorganic layer 30 in the hank 3 may be able to prevent the lateral erosion in the display region of the display panel caused by the ambient moisture and oxygen. Meanwhile, when the metal layer 31 in the bank 3 is in contact with the moisture and oxygen, a dense metal oxide film may be formed, which may further prevent the moisture and oxygen from entering the display region of the display panel. Thus, the damage to the display element 2 caused by the ambient moisture and oxygen may be suppressed, and the performance and life time of the display panel may be improved.

When the thickness of the inorganic layer 30 and the metal layer 31 is substantially small, the ambient moisture and oxygen may not be effectively isolated. When the thickness of the inorganic layer 30 is substantially large, the stress of the inorganic layer 30 may be increased due to the poor ductility of the inorganic material. When the display panel is cut or bent, cracks are likely to occur, and the moisture and oxygen barrier properties of the bank may be also affected.

The metal layer 31 may be able to release the stress of the inorganic layer stress. However, when the thickness of the metal layer 31 is substantially large, the neutral plane may deviate from the organic light-emitting layer, damaging the organic light-emitting layer during the bending and degrading the display performance. Further, when the thickness of the metal layer 31 is substantially large, the bending radius may also be substantially large, and the inorganic layer on the bank 3 may likely have bending cracks.

Thus, in one embodiment, the thickness h1 of the inorganic layer 30 in the bank may be configured to be approximately 100 nm≤h1≤1000 nm and the thickness h2 of the metal layer 31 in the bank may be configured to be approximately 100 nm≤h2≤500 nm. Because the bank 3 includes a plurality of metal layers 31 and a plurality of inorganic layers 30, the thickness h of the bank 3 may be configured to be approximately 200 nm≤h≤4000 nm, taking into account the limitation of the film forming process in the semiconductor device, the thickness h of the bank 3 may be configured to be approximately 200 nm≤h≤4000 nm.

Further, the width of the inorganic layer 30 and the metal layer 31 in the bank may be determined according to various application scenarios. In one embodiment, the width d1 of the inorganic layer 30 in the bank may be configured to be approximately 10 μm≤d1≤100 μm, and the width d2 of the metal layer 31 in the bank may be configured to be approximately 1 μm≤d2≤50 μm. As shown in FIG. 2, the width d1 of the inorganic layer 30 may be configured to be larger than the width d2 of the metal layer 31, such that the inorganic layer 30 in the bank 3 may sufficiently encapsulate or wrap the metal layer 31. Thus, when the moisture and oxygen in the external environment is not in contact with the metal layer 31 of the bank 3, the inorganic layer 30 disposed outside the metal layer 31 may be able to sufficiently block the moisture and oxygen, thereby increasing the reliability of the bank 3 against the lateral erosion of the display panel.

Figure 3:
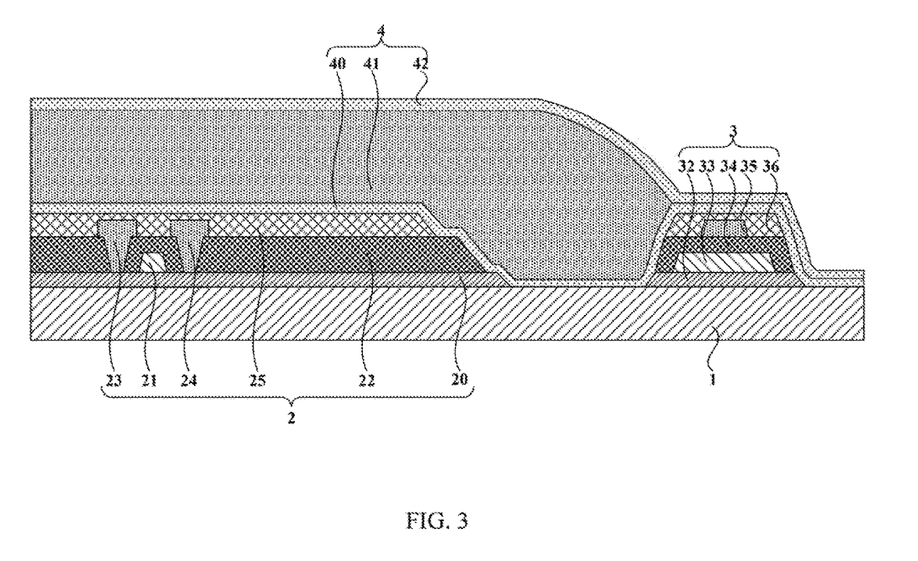
FIG. 3 illustrates a sectional view of another exemplary display panel consistent with the disclosed embodiments.

FIG. 3 illustrates a sectional view of another exemplary display panel consistent with the disclosed embodiments. The similarities between FIG. 3 and FIG. 1 are not repeated here, while certain difference may be explained.

As shown in FIG. 3, the display panel may include a substrate 1, a display element 2 and a bank 3. The substrate 1 may include a display region and a non display region, the display element 2 may be disposed in the display region of the substrate 1, and the bank 3 may be disposed in the non-display region of the substrate 1 and surrounding the display region of the substrate 1.

The bank 3 may include a plurality of inorganic layers and a plurality of metal layers alternately arranged on the substrate 1, in a direction perpendicular to the substrate 1. In one embodiment, as shown in FIG. 3, the bank 3 may include a first inorganic layer 32, a first metal layer 33, a second inorganic layer 34, a second metal layer 35, and a third inorganic layer 36, which may be sequentially disposed on the substrate 1. The second inorganic layer 34 may encapsulate or wrap the first metal layer 33, and the third inorganic layer 36 may encapsulate or wrap the second metal layer 35.

The display element 2 has a first surface facing the substrate 1 and an opposing surface. A first insulating layer 20, a second insulating layer 22 and a third insulating layer 25 may be sequentially disposed on the opposing surface of the display element 2, i.e., the surface far away from the substrate 1. In the display region of the display panel, the first insulating layer 20, the second insulating layer 22 and the third insulating layer 25 may effectively prevent the lateral erosion of the display element 2 caused by the ambient moisture oxygen. On the other hand, the first metal layer 33 and the second metal layer 35 may form a dense metal oxide film when exposed to moisture and oxygen, and the formed metal oxide film may also prevent the lateral erosion of the display element 2 caused by the ambient moisture oxygen, thereby increasing the reliability of the bank 3 against the ambient moisture oxygen, and further improving the life time and performance of the display panel.

Table 1 shows the measured moisture vapor transmission rate (MVTR) of the banks in different configurations. As shown in Table 1, the $1^{st}$ bank includes a plurality of inorganic layers disposed on the metal layer. The $2^{nd}$ bank is the bank provided by the present disclosure and includes a plurality of inorganic layers and a plurality of metal layers alternately disposed. The inorganic layers in the bank and the inorganic layers in the $2^{nd}$ bank have the same thickness, and the metal layer in $1^{st}$ bank has a half thickness of the metal layer in the $2^{nd}$ bank. Comparing the MVTR of the bank and the $2^{nd}$ bank, the MVTR of the $2^{nd}$ bank according to the disclosed embodiments is much smaller than the MVTR of the $1^{st}$ bank.

On the other hand, the $3^{rd}$ bank includes a plurality of inorganic layers disposed on the metal layer. The $2^{nd}$ bank is the bank provided by the present disclosure and includes a plurality of inorganic layers and a plurality of metal layers alternately disposed. The inorganic layers in the $3^{rd}$ bank and the inorganic layers in the $2^{nd}$ bank have the same thickness, and the metal layer in $3^{rd}$ bank and the metal layer in the $2^{nd}$ bank also have the same thickness. Comparing the MVTR of the $3^{rd}$ bank and the $2^{nd}$ bank, the MVTR of the $2^{nd}$ bank according to the disclosed embodiments is much smaller than the MVTR of the $3^{rd}$ bank.

According to Table 1, when the bank in the display panel includes a plurality of inorganic layers and a plurality of metal layers alternately disposed, the MVTR of the bank may be reduced, the moisture and oxygen may be more of blocked. Accordingly, the capability of suppressing the lateral erosion of the display region of the display panel, which is caused by the ambient moisture and oxygen, may be improved, and the life time of the organic electroluminescent device may be significantly improved.

TABLE 1

Moisture vapor transmission rate (MVTR) of banks of different configuration

| No. | Configuraion of bank | Thickness of each inorganic layer (nm) | Thickness of each metal layer (nm) | Moisture vapor transmission rate (MVTR) (g/[m²-day]) |
|---|---|---|---|---|
| $1^{st}$ bank | meta layer/inorganic layer/inorganic layer/inorganic layer | 1000 | 600 | $8.1 \times 10^{-5}$ |
| $2^{nd}$ bank | inorganic layer/metal layer/inorganic layer/metal layer/inorganic layer | 1000 | 300 | $5.2 \times 10^{-6}$ |
| $3^{rd}$ bank | metal layer/inorganic layer/inorganic layer/inorganic layer | 1000 | 300 | $33 \times 10^{-5}$ |

Meanwhile, through introducing the bank having a plurality of inorganic layers and a plurality of metal layers alternately disposed, in which the first inorganic layer 32, the first metal layer 33, the second inorganic layer 34, the second metal layer 35, and the third inorganic layer 36 may be sequentially disposed on the substrate 1, and the second inorganic layer 34 may encapsulate or wrap the first metal layer 33, and the third inorganic layer 36 may encapsulate or wrap the second metal layer 35, the stress exerted on the bank 3 of the non-display region may be well distributed.

Thus, cracks or breakages in the bending or cutting of the display panel may be reduced, and the degradation of the moisture and oxygen barrier properties of the bank 3 caused by the cracks or breakages may be suppressed. Further, the stress resistance of the bank 3 may be improved, which may increase the flexibility of the display panel, i.e., enabling the display panel to be a flexible display panel.

In one embodiment, the thickness of the first inorganic layer 32, the second inorganic layer 34, and the third inorganic layer 36 each may be approximately 1000 nm, and the width of the first inorganic layer 32, the second inorganic layer 34, and the third inorganic layer 36 each may be approximately 50 μm, the thickness of the first metal layer 33 and the second metal layer 35 each may be approximately 300 nm, and the width of the first metal layer 33 and the second metal layer 35 each may be approximately 30 μm.

| No. | Thickness of each inorganic layer (nm) | Width of each inorganic layer (μm) | Thickness of each metal layer (nm) | Width of each metal layer (μm) | Moisture vapor transmission rate (MVTR) (g/[m²-day]) |
|---|---|---|---|---|---|
| $1^{st}$ bank | 500 | 50 | 300 | 30 | $7.9 \times 10^{-4}$ |
| $2^{nd}$ bank | 1000 | 50 | 300 | 30 | $5.2 \times 10^{-6}$ |
| $3^{rd}$ bank | 2000 | 50 | 300 | 30 | $6.1 \times 10^{-5}$ |
| $4^{th}$ bank | 1000 | 40 | 300 | 30 | $5.8 \times 10^{-4}$ |
| $5^{th}$ bank | 1000 | 50 | 600 | 30 | $2.3 \times 10^{-5}$ |
| $6^{th}$ bank | 1000 | 60 | 300 | 30 | $2.7 \times 10^{-5}$ |
| $7^{th}$ bank | 1000 | 50 | 100 | 30 | $7.0 \times 10^{-4}$ |
| $8^{th}$ bank | 1000 | 50 | 300 | 10 | $4.6 \times 10^{-5}$ |
| $9^{th}$ bank | 1000 | 50 | 300 | 50 | $1.4 \times 10^{-3}$ |

Table 2 shows the measured moisture vapor transmission rate (MVTR) of the banks with various thickness of the inorganic layer and metal layer. As shown in Table 1 the measured MVTR of the $1^{st}$ bank, $2^{nd}$ bank, and $3^{rd}$ bank may show the influence of the thickness of the inorganic layer on the MVTR of the bank. That is, when the thickness of the inorganic layer is about 1000 nm, the MVTR of the bank is the smallest, i.e., the moisture and oxygen barrier property of the bank is the best. When the thickness of the inorganic layer is substantially small, the moisture and oxygen in the external environment may easily enter the display region of the display panel through the inorganic layer. When the thickness of the inorganic layer is substantially large, the stress of the inorganic layer may increase, and cracks may tend to occur when the display panel is cut or bent, degrading the moisture and oxygen barrier property of the bank.

The measured MVTR of the $2^{nd}$ bank, the $5^{th}$ bank, and $7^{th}$ bank may show the influence of the thickness of the metal layer on the MVTR of the bank. That is, when the thickness of the metal layer is about 300 nm, the MVTR of the bank is the smallest, i.e., the moisture and oxygen barrier property of the bank is the best. When the thickness of the metal layer is substantially small, the moisture and oxygen in the external environment may easily enter the display region of the display panel. When the thickness of the metal layer is increased, the inorganic layer disposed on the metal layer may be further away from the neutral plane, the bending radius of the ignorance layer may be increased, and cracks may tend to occur, degrading the moisture and oxygen barrier property of the bank.

The measured MVTR of the $2^{nd}$ bank, the $4^{th}$ bank, and $6^{th}$ bank may show the influence of the width of the inorganic layer on the MVTR of the bank. That is, when the width of the inorganic layer is about 50 μm, the MVTR of the bank is the smallest, i.e., the moisture and oxygen barrier property of the bank is the best. When the width of the inorganic layer is substantially large, cracks may tend to occur when the display panel is cut or bent, degrading the moisture and oxygen barrier property of the bank. When the width of the inorganic layer is substantially small, the encapsulation or the wrap of the metal layer may be degraded, and the moisture and oxygen in the external environment may easily enter the display region of the display panel through the side surface of the bank, degrading the moisture and oxygen barrier property of the bank.

The measured MVTR of the $2^{nd}$ bank, the $8^{th}$ bank, and $9^{th}$ bank may show the influence of the width of the metal layer on the MVTR of the bank. That is, when the width of the metal layer is about 30 μm, the MVTR of the bank is the smallest, i.e. the moisture and oxygen barrier property of the bank is the best. When the metal layer in the bank is in contact with moisture and oxygen, a dense oxide metal film may be formed, which may completely block the ambient moisture and oxygen. On the other hand, the stress of the inorganic layer covering the metal layer may be released.

When the width of the metal layer is substantially large, the inorganic layer on the metal layer may be substantially thin, degrading the moisture and oxygen barrier property of the bank. When the width of the metal layer is substantially small, the contacting surface between the metal layer and the inorganic layer may be reduced, and cracks may tend to occur when the display panel is cut or bent, degrading the moisture and oxygen barrier property of the bank.

From the above analysis of the experimental data in Table 2, when the first inorganic layer 32, the second inorganic layer 34 and the third inorganic layer 36 each has a thickness of about 1000 nm and a width of about 50 μm, and the first metal layer 33 and the second metal layer 35 each has a thickness of about 300 nm and a width of about 30 μm, the MVTR of the bank is the smallest, i.e., the moisture and oxygen barrier property of the bank is the best. Accordingly, the capability of the bank against the lateral erosion of the display panel caused by the ambient moisture and oxygen may be larger, and the life time of the organic electroluminescent device may be further extended.

In one embodiment, as shown in FIG. 3, the display element 2 located in the display region of the substrate 1 may include a plurality of thin-film-transistors (TFTs) and a plurality of light-emitting elements. A TFT may include a first insulating layer 20, a gate electrode 21, the second insulating layer 22, a source electrode 23, a drain electrode 24, and the third insulating layer 25, which are sequentially disposed on the substrate 1. When forming the TFT on the substrate 1, each of the film layers constituting the TFT may be sequentially formed on the substrate 1 by physical, or chemical vapor deposition, etc.

For example, each of the film layers constituting the TFT may be sequentially formed on the substrate 1 by plasma enhanced chemical vapor deposition. The plasma enhanced chemical vapor deposition requires a substantially low deposition temperature and, thus, the structure and physical properties of the film layer may be less affected, the thickness and composition uniformity of the film layer may be enhanced. Further, the formed film layer may be dense, and have strong adhesion.

After performing a patterning process of each film layer, such as coating a photo-resist layer, exposing, developing, and etching, the first insulating layer 20, the gate electrode 21, the second insulating layer 22, the source electrode 23, the drain electrode 24, and the third insulating layer 25 of the TFT may be sequentially formed on the substrate 1.

In certain embodiments, the TFT may further include a metal oxide semiconductor layer, i.e., an active layer, and the material constituting the active layer may include, for example, indium gallium zinc oxide (IGZO). IGZO is an amorphous oxide containing indium, gallium and zinc. The carrier mobility of IGZO is substantially high, which may enable the IGZO to have improved charge and discharge rate to the pixel electrode. Accordingly, the response speed of the pixel may be improved, and the ultra-high resolution may be realized. In certain embodiments, the source electrode 23 and the drain electrode 24 of the TFT may be in contact with the active layer via through-holes (not shown in FIG. 3).

Further, at least one metal layer of the bank 3 may be disposed in the same layer as the gate electrode 21, the source electrode 23 or the drain electrode 24, and at least one inorganic layer of the bank 3 may be disposed in the same layer as the first insulating layer 20, the second insulating layer 22, or the third insulating layer 25.

In one embodiment, as shown in FIG. 3, the first inorganic layer 32 may be disposed in the same layer as the first insulating layer 20, the gate electrode 21 may be disposed in the same layer as the first metal layer 33, and the second insulating layer 22 may be disposed in the same layer as the second inorganic layer 34, the source electrode 23 and the drain electrode 24 may be disposed in the same layer as the second metal layer 35, and the third insulating layer 25 may be disposed in the same layer as the third inorganic layer 36.

The material of the inorganic layer in the bank 3 may include at least one of $SiN_X$, $SiO_2$ and $Al_2O_3$, and the material of the metal layer in the bank 3 may include at least one of Mo, Cr, Ti or Al. In one embodiment, the films formed in the same layer may be made of the same material. For example, both the first inorganic layer 32 and the first insulating layer 20 may be made of $SiO_2$ or $SiN_X$, or $Al_2O_3$, or may have a laminated structure formed by $SiN_X$, $SiO_2$ and $Al_2O_3$. During the fabrication of the display panel, to form the first inorganic layer 32 and the first insulating layer 20 in the same layer, a layer of the $SiO_2$ may be formed first and the photolithography process may be performed. Both the first metal layer 33 and the gate electrode 21 may be made of one of Mo, Cr, Ti and Al, or may have a laminated structure formed by Mo, Cr, Ti and Al.

Thus, through forming at least one metal layer of the bank 3 in the same layer as the gate electrode 21, the source electrode 23 or the drain electrode 24, and forming at least one inorganic layer of the bank 3 in the same layer as the first insulating layer 20, the second insulating layer 22, or the third insulation layer 25, the fabrication process of the display panel may be simplified, and the production efficiency of the display panel may be improved.

It is to be noted that, the accompany drawings illustrate the size of each element in the display panel and the thickness of each film layer, which are for illustrative purposes, and are not intended to represent the actual dimensions of the elements in the display panel and the actual thickness of the film layers.

In the disclosed embodiments, the bank may be disposed in the non-display region of the substrate and surrounding the display region. The bank may comprise at least one inorganic layer and at least one metal layer, and the inorganic layer may encapsulate the metal layer. When there is a defect in the inorganic thin film layer of the thin film encapsulation layer covering the bank, the inorganic layer in the bank and encapsulating the metal layer may effectively block the ambient moisture and oxygen entering through the defects in the inorganic layer of the thin film encapsulation layer.

Meanwhile, when the metal layer is in contact with the moisture in the ambient environment, a dense oxide film may be formed, which may further prevent the lateral erosion in the display region of the display panel caused by the ambient moisture and oxygen entering through the defects in the inorganic layer of the thin film encapsulation layer. Thus, the capability of the display panel to block ambient moisture and oxygen may be enhanced, and the life time of the organic electroluminescent device may be improved, accordingly.

Figure 4:
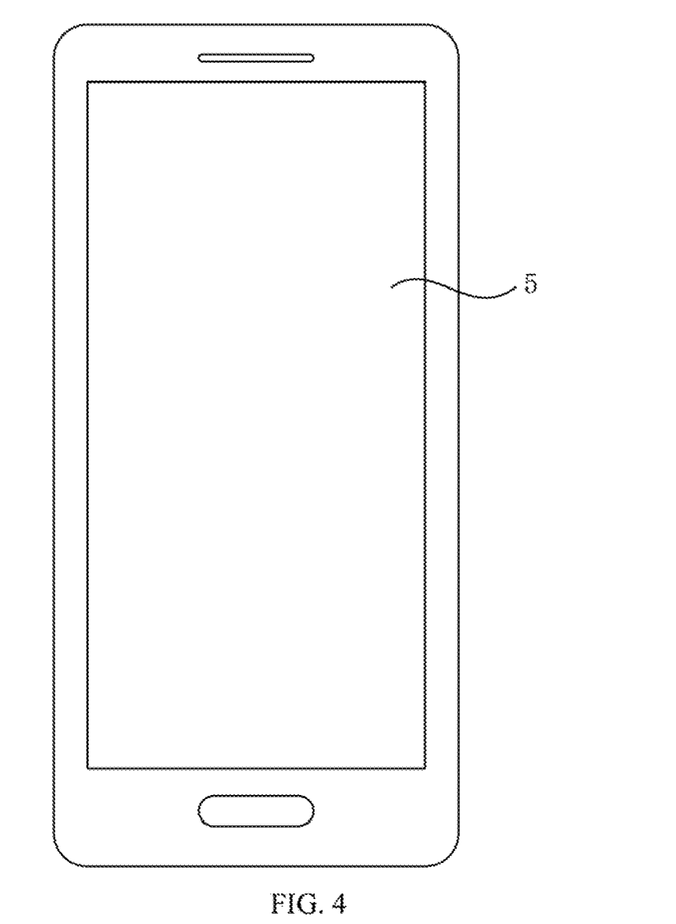
FIG. 4 illustrates a schematic view of an exemplary display apparatus consistent with the disclosed embodiments.

The present disclosure also provides a display apparatus. FIG. 4 illustrates a schematic view of an exemplary display apparatus consistent with the disclosed embodiments. As shown in FIG. 4, the display apparatus may include a display panel 5, which may any one of the disclosed display panel. In one embodiment, the display panel 5 may be an organic light-emitting display panel including a plurality of any appropriate organic light-emitting elements, such as OLEDs and, accordingly, the display apparatus may be an organic light-emitting display apparatus.

Because the display apparatus may include any one of the disclosed display panels, the display apparatus may also exhibit the same advantages as the disclosed display panel, which are not repeated here. Although a smart phone is shown in FIG. 4, the display apparatus may be a smart watch, a VR goggle, a smart hand band, an electronic paper, a television set, an automotive display, a notebook computer, a tablet computer, or any appropriate display apparatus, which is not limited by the present disclosure.

The present disclosure provides a display panel and a display apparatus thereof. The display panel may comprise a substrate including a display region and a non-display region, a display element disposed in the display region of the substrate, and at least one bank disposed in the non-display region of the substrate and surrounding the display region. The at least one bank may comprise at least one inorganic layer and at least one metal layer, and the least one inorganic layer may encapsulate the least one metal layer.

When there is a defect in the inorganic thin film layer of the thin film encapsulation layer covering the bank, the inorganic layer in the bank and encapsulating the metal layer may effectively block the ambient moisture and oxygen entering through the defects in the inorganic layer of the thin film encapsulation layer. Meanwhile, when the metal layer is in contact with the moisture in the ambient environment, a dense oxide film may be formed, which may further prevent the lateral erosion in the display region of the display panel caused by the ambient moisture and oxygen entering through the defects in the inorganic layer of the thin film encapsulation layer. Thus, the capability of the display panel to block ambient moisture and oxygen may be enhanced, and the life time of display panel may be improved, accordingly.

Further, the bank including the inorganic layer and the metal layer may increase the flexibility of the display panel, which may enable the display panel to be a flexible display panel. The bank may also realize an anti-static function.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention.

Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A display panel, comprising:
a substrate including a display region and a non-display region;
a display element disposed in the display region of the substrate;
at least one bank disposed in the non-display region of the substrate and disposed surrounding the display region; and
a thin film encapsulation layer including at least one inorganic layer, wherein:
the at least one bank includes a first inorganic layer, a first metal layer, a second inorganic layer, a second metal layer, and a third inorganic layer sequentially disposed on the substrate,
the first metal layer is encapsulated between, and in contact with, the first inorganic layer and the second inorganic layer,
the second metal layer is encapsulated between, and in contact with, the second inorganic layer and the third inorganic layer, and
the at least one inorganic layer in the thin film encapsulation layer is in contact with at least one of the first inorganic layer, the second inorganic layer or the third inorganic layer.

2. The display panel according to claim 1, wherein:
the at least one bank has a thickness h of approximately 200 nm≤h≤4000 nm.

3. The display panel according to claim 1, wherein:
at least one of the first inorganic layer, the second inorganic layer or the third inorganic layer in the at least one bank has a thickness h1 of approximately 100 nm≤h1≤1000 nm.

4. The display panel according to claim 1, wherein:
at least one of the first metal layer or the second metal layer in the at least one bank has a thickness h2 of approximately 100 nm≤h2≤500 nm.

5. The display panel according to claim 1, wherein:
at least one of the first inorganic layer, the second inorganic layer or the third inorganic layer in the at least one bank has a width w1 of approximately 10 μm≤w1≤100 μm.

6. The display panel according to claim 1, wherein:
at least one of the first metal layer or the second metal layer in the at least one bank has a width w2 of approximately 1 μm≤w2≤50 μm.

7. The display panel according to claim 1, wherein:
the thin film encapsulation layer covers the display element.

8. The display panel according to claim 1, wherein:
the first inorganic layer, the second inorganic layer, and the third inorganic layer each has a thickness of approximately 1000 nm and a width of approximately 50 μm; and
the first metal layer and the second metal layer each has a thickness of approximately 300 nm and a width of approximately 30 μm.

9. The display panel according to claim 1, wherein:
the at least one inorganic layer in the thin film encapsulation layer covers the at least one bank.

10. The display panel according to claim 1, wherein:
the display element comprises a plurality of thin-film-transistors (TFTs) and a plurality of light-emitting elements; and
a TFT comprises a first insulating layer, a gate electrode, a second insulating layer, a source electrode, a drain electrode, and a third insulating layer, which are sequentially disposed on the substrate.

11. The display panel according to claim 10, wherein:
at least one of the first metal layer or the second metal layer in the at least one bank is disposed in a same layer as the gate electrode, the source electrode, or the drain electrode.

12. The display panel according to claim 10, wherein:
at least one of the first metal layer or the second metal layer in the at least one bank is disposed in a same layer as the first insulating layer, the second insulating layer, or the third insulating layer.

13. The display panel according to claim 10, wherein:
the first inorganic layer is disposed in a same layer as the first insulating layer;
the gate electrode is disposed in a same layer as the first metal layer;
the second insulating layer is disposed in a same layer as the second inorganic layer;
the source electrode and the drain electrode are disposed in a same layer as the second metal layer; and
the third insulating layer is disposed in a same layer as the third inorganic layer.

14. The display panel according to claim 1, wherein:
the thin-film encapsulation layer further includes another inorganic layer and an organic layer, and
the organic layer is disposed between the at least one inorganic layer and the another inorganic layer.

15. The display panel according to claim 14, wherein:
the at least one bank has a surface facing the substrate and an opposing surface, and
the at least one inorganic layer and the another inorganic layer are disposed on the opposing surface of the at least one bank, encapsulating the at least one bank.

16. A display apparatus, comprising:
a display panel,
wherein the display panel comprises:
  a substrate including a display region and a non-display region;
  a display element disposed in the display region of the substrate;
  at least one bank disposed in the non-display region of the substrate and surrounding the display region; and
  a thin film encapsulation layer including at least one inorganic layer, wherein:
    the at least one bank includes a first inorganic layer, a first metal layer, a second inorganic layer, a second metal layer, and a third inorganic layer sequentially disposed on the substrate,
    the first metal layer is encapsulated between, and in contact with, the first inorganic layer and the second inorganic layer,
    the second metal layer is encapsulated between, and in contact with, the second inorganic layer and the third inorganic layer, and
    the at least one inorganic layer in the thin film encapsulation layer is in contact with at least one of the first inorganic layer, the second inorganic layer or the third inorganic layer.

17. The display apparatus according to claim 16, wherein:
the at least one bank has a thickness h of approximately 200 nm≤h≤4000 nm;
at least one of the first inorganic layer, the second inorganic layer or the third inorganic layer in the at least one bank has a thickness h1 of approximately 100 nm≤h1≤1000 nm and a width w1 of approximately 10 μm≤w1≤100 μm;
at least one of the first metal layer or the second metal layer in the at least one bank has a thickness h2 of approximately 100 nm≤h2≤500 nm and a width w2 of approximately 1 μm≤w1≤50 μm.

18. The display apparatus according to claim 16, wherein:
the thin film encapsulation layer covers the display element; and
the at least one inorganic layer in the thin film encapsulation layer covers the at least one bank.

19. The display apparatus according to claim 16, wherein:
the display element comprises a plurality of thin-film-transistors (TFTs) and a plurality of light-emitting elements; and
a TFT comprises a first insulating layer, a gate electrode, a second insulating layer, a source electrode, a drain electrode, and a third insulating layer, which are sequentially disposed on the substrate,
wherein
at least one of the first metal layer or the second metal layer in the at least one bank is disposed in a same layer as the gate electrode, the source electrode, the drain electrode, the first insulating layer, the second insulating layer, or the third insulating layer.

20. The display apparatus according to claim 16, wherein:
the thin-film encapsulation layer further includes another inorganic layer and an organic layer, and
the organic layer is disposed between the at least one inorganic layer and the another inorganic layer.

* * * * *